US006768676B2

(12) United States Patent
Hirano

(10) Patent No.: US 6,768,676 B2
(45) Date of Patent: Jul. 27, 2004

(54) NONVOLATILE SEMICONDUCTOR MEMORY DEVICE

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 10/350,332

(22) Filed: Jan. 24, 2003

(65) Prior Publication Data

US 2003/0137876 A1 Jul. 24, 2003

(30) Foreign Application Priority Data

Jan. 24, 2002 (JP) ........................................ 2002-015814

(51) Int. Cl.[7] .............................................. G11C 16/04
(52) U.S. Cl. ............................ 365/185.18; 365/185.19; 365/185.22
(58) Field of Search ..................... 365/185.18, 185.19, 365/185.22, 189.09, 230.06

(56) References Cited

U.S. PATENT DOCUMENTS 5,991,201 A  * 11/1999 Kuo et al. ............. 365/185.19
6,366,496 B1    4/2002 Torelli et al.

FOREIGN PATENT DOCUMENTS

JP   2001-057091    2/2001

OTHER PUBLICATIONS

"40–mm² 3–V–Only 50 MHz 64Mb 2–b/cell CHE NOR Flash Memory" by Giovanni Campardo et al.; IEEE Journal of Solid–State Circuits, vol. 35, No. 11, pp. 1655–1667, c. 2000.

* cited by examiner

Primary Examiner—David Lam
(74) Attorney, Agent, or Firm—Morrison & Foerster LLP

(57) ABSTRACT

This nonvolatile semiconductor memory device includes a word line regulator circuit 22, which supplies a voltage to a word line, a program/erase control circuit 21, which outputs a write control signal to the word line regulator circuit 22, and a pulse voltage step width storage circuit 23, which stores information of a voltage increment $\Delta Vg$. The word line regulator circuit 22 supplies a voltage to a word line according to the write control signal from the program/erase control circuit 21 based on the information of a voltage increment $\Delta Vg$ stored in the pulse voltage step width storage circuit 23. A voltage increment $\Delta Vg$ by which a threshold voltage change of a memory cell becomes a predetermined voltage can be set for each chip by the pulse voltage step width storage circuit 23. Consequently, a highly reliable multi-valued write operation can be performed.

6 Claims, 14 Drawing Sheets

DATA "00"
(PROGRAMMED STATE)

DATA "01"
(PROGRAMMED STATE)

DATA "10"
(PROGRAMMED STATE)

DATA "11"
(ERASED STATE)

Fig. 11A
*PRIOR ART*
Fig. 11B
*PRIOR ART*
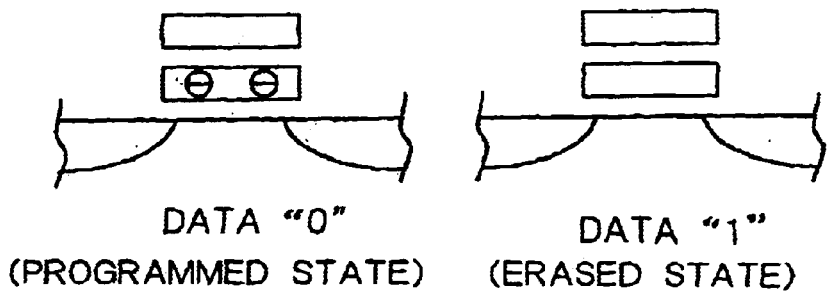
DATA "0"
(PROGRAMMED STATE)
DATA "1"
(ERASED STATE)
Fig. 12
*PRIOR ART*
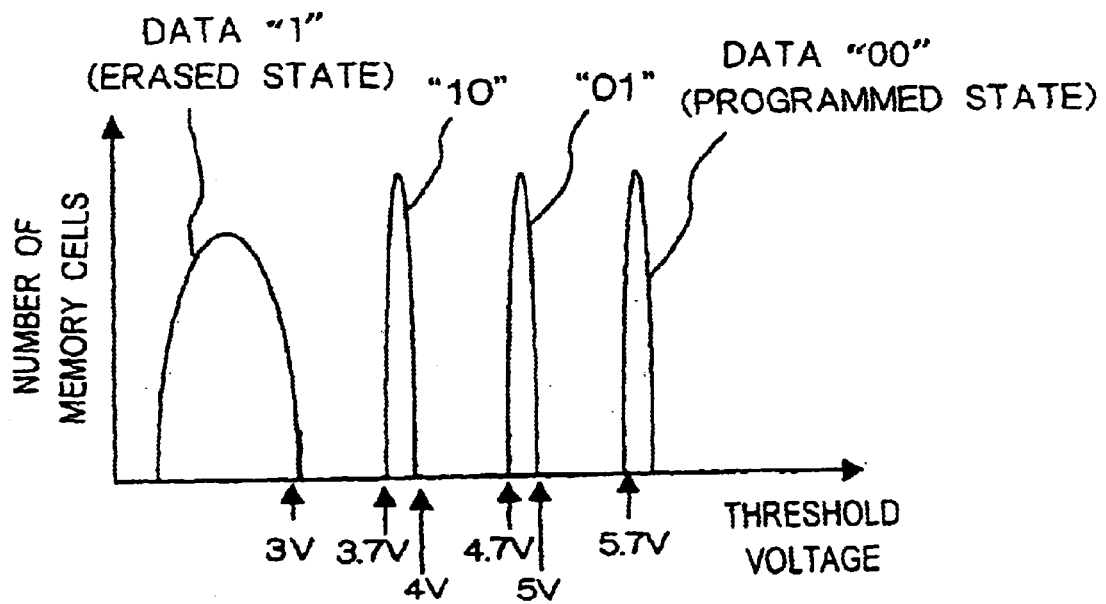

NONVOLATILE SEMICONDUCTOR MEMORY DEVICE

BACKGROUND OF THE INVENTION

The present invention relates to a nonvolatile semiconductor memory device, in particular, a nonvolatile semiconductor memory device employing a multi-valued write method using channel hot electrons.

Conventionally, as a most commonly used nonvolatile semiconductor memory device, flash memory of an ETOX (EPROM Thin Oxide, a registered trade name of a product of Intel Corporation) type can be mentioned. FIG. 8 is a schematic cross sectional view showing a memory cell of this ETOX-type flash memory. As shown in FIG. 8, a floating gate 64 is formed on a substrate 60 on which a source 61 and a drain 62 are formed with a predetermined gap therebetween and a region between the source 61 and the drain 62 via a tunnel oxide film 63, and a control gate 66 is further formed on the floating gate 64 via an interlayer insulating film 65.

An operation principle of this ETOX-type flash memory is described below. As shown in Table 1 as voltage conditions, at the time of a write operation, a write voltage Vpp (for example, 9 V) is applied to the control gate 66, a standard voltage Vss (for example, 0 V) is applied to the source, and a voltage of 5 V is applied to the drain 62.

TABLE 1

|       | Control gate | Drain    | Source | Substrate |
|-------|--------------|----------|--------|-----------|
| Write | 9 V          | 5 V/open | 0 V    | 0 V       |
| Erase | −9 V         | Open     | 6 V    | 0 V       |
| Read  | 5 V          | 1 V      | 0 V    | 0 V       |

It is noted that the drain 62 of a memory cell to which data is not written is opened. Consequently, a large amount of current flows in a channel layer, hot electrons are generated in a portion on the drain side where an electric field is high, electrons are implanted into the floating gate 64, and a threshold voltage of the memory cell is raised. FIG. 9 shows a state of threshold voltages of two-valued flash memories. The right side of FIG. 9 is a distribution state of threshold voltages in a program (written) state with data "0".

Furthermore, at the time of an erase operation, Vnn (for example, −9 V) is applied to the control gate 66, Vpe (for example, 6 V) is applied to the source 61, and electrons are pulled from the floating gate 64 on the source side to lower a threshold voltage. The left side of FIG. 9 is a distribution state threshold voltages in an erased state with data "1". Upon this erase operation, a BTBT (Band To Band Tunneling) current flows from the source side to the substrate 60. When this current is generated, hot holes and hot electrons are generated at the same time. Of these, the hot electrons flow to the drain 62, but, on the other hand, the hot holes are pulled to the tunnel oxide film 63 side and trapped inside the tunnel oxide film 63. Generally, this trap is considered to deteriorate reliability.

Furthermore, at the time of a read operation, 1 V is applied to the drain 62, and 5 V is applied to the control gate 66. When a memory cell is in an erased state and the threshold voltage is low, a current flows through the memory cell, and data "1" is determined. On the other hand, when a memory cell is in a program state and the threshold voltage is high, a current does not flow through the memory cell, and data "0" is determined.

Meanwhile, recently, multi-valued techniques are being developed for the purpose of lower costs. FIGS. 10A to 10D are conceptual diagrams showing a state electrons in a floating gate in the case of a four-valued flash memory using the multi-valued technique (the one shown in FIG. 10 is a four-valued one, while FIG. 11 shows a two-valued one for comparison). As shown in FIG. 10, a state at each level is determined by the number of electrons in the floating gate. The state of the threshold voltage in this case is divided into four threshold voltage levels as shown in FIG. 12 as follows.

Data "00": threshold voltage of 5.7 V or higher
Data "01": threshold voltage of 4.7–5.0 V
Data "10": threshold voltage of 3.7–4 V
Data "11": threshold voltage of 3.0 V or lower Such a state of the threshold voltage is adjusted by controlling the amount of electrons to be implanted into the floating gate by utilizing a characteristic that the threshold voltage is changed by the number of electrons in the floating gate shown in FIG. 10.

A point of this multi-valued technique is how the threshold voltage (in particular, threshold voltages for data "01" and data "10", which are intermediate levels) is made within a predetermined threshold voltage.

Procedures of this multi-valued technique are described below. A general write method is disclosed in Japanese Patent Laid-Open Publication No. 2001-57091 and IEEE J. Solid-State Circuits, Vol. 35, No. 41, pp. 1655–1667, November, 2000, "40 mm$^2$ 3 V Only 50 MHz 64 Mb 2 b/cell CHE NOR Flash Memory". The method described in these references includes procedures in which program (write) pulse application and a verify operation for verifying a threshold voltage of a memory cell after program pulse application are repeated, and the drain of a memory cell of which threshold voltage reaches a predetermined threshold voltage is opened in subsequent program pulse application so that a drain voltage is not applied thereto, while 5 V is applied to the drain of a memory cell of which threshold voltage does not reach the predetermined threshold voltage, and a program pulse is applied to continue a write operation. When threshold voltages of all memory cells to be programmed (written) finally reach the predetermined threshold voltage, the write operation is terminated.

In particular, a procedure is described in which a voltage applied to the control gate is set to be low at the time of a first program (write) operation and the voltage of the control gate is raised by a certain voltage for each program pulse application in order to increase a program (write) speed in this case. FIG. 13 shows a write algorithm in this case.

As shown in FIG. 13, when a program is started, N is set at zero in step S1, and a verify operation is performed in step S2 to determine whether a threshold voltage of a memory cell is 3.7 V or higher. Then, when the threshold voltage of the memory cell is lower than 3.7 V, N is increased by an increment (N+1) in step S3. The operation proceeds to step S4, and a gate voltage Vg (=Vg10) is raised by $\Delta Vg \times (N-1)$. In step S5, a write pulse having a voltage of $Vg + \Delta Vg \times (N-1)$ is applied to the control gate. Then, the operation returns to step S2, and steps S2 to S5 are repeated until the threshold voltage of the memory cell becomes 3.7 V or higher.

On the other hand, when the threshold voltage of the memory cell is 3.7 V or higher in step S2, the operation proceeds to step S11, and N is set at zero. A verify operation is performed in step S12 to determine whether the threshold voltage of the memory cell is 4.7 V or higher. Then, when the threshold voltage of the memory cell is lower than 4.7 V, N is increased by an increment (N+1) in step S13. The operation proceeds to step S14, and the gate voltage Vg (=Vg01) is raised by $\Delta Vg \times (N-1)$. In step S15, a write pulse having a voltage of Vg +$\Delta Vg \times (N-1)$ is applied to the control gate. Then, the operation returns to step S12, and steps S12 to S15 are repeated until the threshold voltage of the memory cell becomes 4.7 V or higher.

On the other hand, when the threshold voltage of the memory cell is 4.7 V or higher in step S12, the operation proceeds to step S21 shown in FIG. 14, and N is set at zero. A verify operation is performed in step S22 to determine whether the threshold voltage of the memory cell is 5.7 V or higher. Then, when the threshold voltage of the memory cell is lower than 5.7 V, N is increased by an increment (N+1) in step S23. The operation proceeds to step S24, and the gate voltage Vg (=Vg00) is raised by $\Delta Vg \times (N-1)$. In step S25, a write pulse having a voltage of Vg +$\Delta Vg \times (N-1)$ is applied to the control gate. Then, the operation returns to step S22, and steps S22 to S25 are repeated until the threshold voltage of the memory cell becomes 5.7 V or higher.

On the other hand, when the threshold voltage of the memory cell is 5.7 V or higher in step S22, this processing is terminated.

In FIG. 13, steps SI to S5 are write processing of data "10", and Vg10 is a start voltage (write start voltage) of data "10" at the time of a write operation. Furthermore, steps S11 to S15 are write processing of data "01", and Vg10 is a start voltage of data "01" at the time of a write operation. Steps S21 to 525 are write processing of data "00", and Vg00 is a start voltage of data "00" at the time of a write operation.

Meanwhile, FIG. 15 shows transition of voltages applied to the control gate in program pulse application.

A write principle of this procedure is described in view of characteristics of a memory cell. First, FIG. 16 shows a distribution of threshold voltages Vt of memory cells when a program pulse is applied once with a gate voltage of Vg10 (for example, 6 V) and a drain voltage of Vd (for example, 5 V). It is shown that the threshold voltages are distributed from 2.7 to 3.7 V. An upper limit of the distribution in this case is 3.7 V (Vtmax), and a lower limit is 2.7 V (Vtmin). Here, after the control gate voltage is set at 6 V and the drain voltage is set at 5 V, for example, a program (write) operation is performed once. A threshold voltage distribution in this case is distribution 1 (corresponding to FIG. 16) shown in FIG. 17. Then, when the control gate voltage is raised successively to 6.5 V and a program (write) operation is performed, the whole threshold voltages shift to distribution 2 shown in FIG. 17. Meanwhile, when the control gate voltage is further increased by 0.5 V to 7 V and a program pulse is applied, the distribution of the threshold voltages of the memory cells becomes as shown as distribution 3. Subsequently, while the control gate voltage is similarly raised and a write operation is performed, the threshold voltage distribution becomes as shown as distribution 4. Relations between the upper limit threshold voltage Vtmax, lower limit threshold voltage Vtmin and control gate voltage at this time are as shown in FIG. 18. This relationship can be converted to relations of the number n of pulses applied when the control gate voltage is raised by each voltage increment $\Delta Vg$. When the upper limit threshold voltage Vtmax and the lower limit threshold voltage Vtmin at the gate voltage of 6 V upon the first program pulse application to the control gate are assumed as Vtmaxi and Vtmini, respectively, the following relations are satisfied:

$$Vtmax = Vtmaxi + \Delta Vg \times (n-1)$$

$$Vtmin = Vtmini + \Delta Vg \times (n-1)$$

(wherein $\Delta Vg$ is Vg–6 V, and n is the number of pulses applied). That is, a relationship of $\Delta Vt = \Delta Vg$ is satisfied.

As shown in these expressions, by setting the voltage increment $\Delta Vg$ of a control gate voltage to be 0.3 V in a program algorithm in which the control gate voltage is raised as described above for data "01" and data "10", the threshold voltage increment can be limited to 0.3 V or lower. That is, the threshold voltage can be set to be 4.7 to 5 V for data "01", and the threshold voltage can be set to be 3.7 to 4 V for data "10". For example, in order to limit a threshold voltage of a memory cell that stores data "10" within a range of 3.7 to 4 V, the control gate voltage is set such that the upper limit threshold voltage Vtmax reaches the range of 3.7 to 4 V. When the control gate voltage in this case is set to be 6 V, the following are obtained:

1st pulse (6 V): Vg Vtmin=2.7 V
2nd pulse (6.3 V): Vg+$\Delta Vg$ Vtmin=3.0 V
3rd pulse (6.6 V): Vg+2$\Delta Vg$ Vtmin=3.3 V
4th pulse (6.9 V): Vg+3$\Delta Vg$ Vtmin=3.6 V
5th pulse (7.2 V): Vg+4$\Delta Vg$ Vtmin=3.9 V With this 5th pulse (voltage applied to the control gate is 7.2 V), the threshold voltage of even a memory cell with the slowest write speed due to variations in write characteristics of memory cells should become 3.9 V or higher, that is, 3.7 V or higher.

In practice, a verify operation is performed for each program pulse application, and a threshold voltage is determined from a memory cell current that flows in a memory cell by this verify operation (basically the same as a read operation) Since the drain of a memory cell of which threshold voltage reaches 3.7 V or higher is opened, and thereafter a write operation is not performed in this processing, all the write operations of memory cells to which data "10" is to be written is terminated with this 5th pulse application.

Thus, since a procedure is used in which a verify operation is performed for each pulse application, and a voltage is not applied to the drain of a memory cell of which threshold voltage reaches 3.7 V or higher, the threshold voltage increment can be limited to 0.3 V or lower.

A threshold voltage of a memory cell that stores data "01" can be limited within a range of 4.7 to 5 V with a similar procedure. That is, by applying pulses so that the upper limit threshold voltage Vtmax reaches the range of 4.7 to 5 V, the lower limit threshold voltage Vtmin becomes 4.8 V with an 8th pulse.

Meanwhile, if characteristics of memory cells vary depending on each device in a four-valued flash memory as the nonvolatile semiconductor memory device, as a practical problem, a device in which the above relationship of $\Delta Vt = \Delta Vg$ is not satisfied occurs. At this time, a problem arises in the following cases (1) and (2).

[(1) In the case of $\Delta Vt > \Delta Vg$]

In the case of, for example, $\Delta Vt = 1.2 \times \Delta Vg$, when the gate voltage is increased by each voltage increment $\Delta Vg = 0.3$ V, a change of the threshold voltage becomes $\Delta Vt = 0.36$ V, and, as a result, the threshold voltage distribution falls within the range of 3.7 to 4.06 V. Consequently, the threshold voltage distribution varies more than predetermined values, and this expansion of the threshold voltage distribution is expected to lead to a decrease of a margin when the memory cell current is decided upon a read operation, resulting in a defective read operation.

[(2) In the case of $\Delta Vt < \Delta Vg$]

In the case of, for example, $\Delta Vt = 0.8 \times \Delta Vg$, when the gate voltage is increased by each voltage increment $\Delta Vg = 0.3$ V, the threshold voltage change becomes $\Delta Vt = 0.24$ V. In this case, the threshold voltage distribution is limited within the predetermined range of 3.7 to 4.0 V, but the following is obtained:

1st pulse (6 V): Vg Vtmin=2.7 V
2nd pulse (6.3 V): Vg+ΔVg Vtmin=2.94 V
3rd pulse (6.6 V): Vg+2ΔVg Vtmin=3.18 V
4th pulse (6.9 V): Vg+3ΔVg Vtmin=3.42 V
5th pulse (7.2 V): Vg+4ΔVg Vtmin=3.66 V
6th pulse (7.2 V): Vg+5ΔVg Vtmin=3.9 V Thus, the number of required pulses is increased. The increase in the number of pulses further result in an increase in the number of verify operations performed for each pulse application, and a problem arises as a result that a program speed is deteriorated.

SUMMARY OF THE INVENTION

Accordingly, an object of the present invention is to provide a nonvolatile semiconductor memory device with which a multi-valued write operation with high reliability can be performed in which a read margin can be secured without being affected by variations in devices and deteriorating a program speed.

In order to achieve the above object, there is provided an electrically writable and erasable nonvolatile semiconductor memory device composed of one or more chips and having memory cells respectively constituted by a floating gate field effect transistor including a control gate, a drain, a source and a floating gate, wherein charged states corresponding to three or more values are generated in the floating gate, comprising:

write means that, at the time of write operation for generating one of two or more charged states of the floating gate corresponding to two or more values, performs a first step of applying a write pulse being a positive write start voltage to the control gate, and thereafter repeatedly performs a second step of applying a write pulse to the control gate of the transistor of a memory cell which is not judged to be in a predetermined charged state, wherein the write pulse in the second step is repeatedly raised by a voltage increment until the transistor of the memory cell becomes the predetermined charged state, wherein a voltage increment setting means for setting the voltage increment in the second step for each chip.

According to the nonvolatile semiconductor memory device having the above constitution, a voltage increment by which the change of the threshold voltage of the memory cell falls within a predetermined voltage width can be set for each chip in the write means without being affected by the variations in devices, and a multi-valued write operation with high reliability can be performed in which read margin can be secured without deteriorating a program speed.

In one embodiment of the present invention, the write means includes:

voltage supply means for supplying a voltage to the control gate;

write control means for outputting a write control signal to the voltage supply means; and storage means for storing information of the voltage increment; and the voltage supply means successively supplies voltages raised by the voltage increment based on the information of the voltage increment stored in the storage means to the control gate according to a write control signal from the write control means.

According to the nonvolatile semiconductor memory device of the above embodiment, since the voltage supply means supplies a voltage successively increased by the voltage increment to the control gate by a write control signal from the write control means based on voltage increment information stored in the storage means, write pulses can be applied to the control gate by the voltage increment set for each chip with a simple constitution.

In one embodiment of the present invention, the write means includes:

voltage supply means for supplying a voltage to the control gate;

write control means for outputting a write control signal to the voltage supply means; and storage means for storing a numerical value corresponding to the voltage increment as information of the voltage increment;

the write control means successively adds a numerical value corresponding to the voltage increment stored in the storage means to the positive write start voltage, and outputs a write control signal representing the positive write start voltage and added results; and the voltage supply means supplies a voltage corresponding to the write control signal from the write control means to the control gate.

According to the nonvolatile semiconductor memory device of the above embodiment, since the write control means outputs a write control signal representing a result obtained by successively adding a numerical value corresponding to a voltage increment stored in the storage means to the numerical value corresponding to the positive write start voltage, and a voltage corresponding to the result represented by the write control signal is supplied from the voltage supply means to the control gate, a write pulse can be applied to the control gate by the voltage increment set for each chip with a simple constitution.

In one embodiment of the present invention, information of the voltage increment by which a change of the threshold voltage of a memory cell obtained by a test of a write characteristic becomes a predetermined voltage is stored in the storage means.

According to the nonvolatile semiconductor memory device of the above embodiment, since information of the voltage increment which is obtained from a test of write characteristics and by which a change in a threshold voltage of a memory cell becomes a predetermined voltage is stored in the storage means, and a voltage is supplied from the voltage supply means to the control gate based on the information stored in the storage means, the change in the threshold voltage of the memory cell can be made within the same predetermined voltage width irrespective of variations in chip characteristics.

In one embodiment of the present invention, a memory cell having the same constitution as the memory cell is used as the storage means.

According to the nonvolatile semiconductor memory device of the above embodiment, since a memory cell having the same constitution as the memory cell is used as the storage means, it is sufficient to use a part of the memory cells constituting a cell array made of the memory cells, for example, and no special storage means needs to be newly designed. Therefore, a chip area can be reduced.

In one embodiment of the present invention, the voltage supply means supplies a voltage generated by a resistive potential divider to the control gate.

According to the nonvolatile semiconductor memory device of the above embodiment, since the voltage supply means supplies a voltage generated by a resistive potential divider made of resistors connected in series to the control gate, a layout area can be reduced with a simplest constitution. Since a resistance ratio is stable even if resistance values vary depending on device (chip) manufacturing conditions, a stable voltage increment can be reliably obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 11A and 11B are views showing states of charges in a floating gate of a two-valued flash memory;

FIG. 12 is a view showing a threshold voltage state of a four-valued flash memory;

DETAILED DESCRIPTION OF THE PREFERRED EMBODIMENTS

Embodiments of the present invention are described in detail with reference to the accompanying drawings.

First Embodiment

Figure 1:
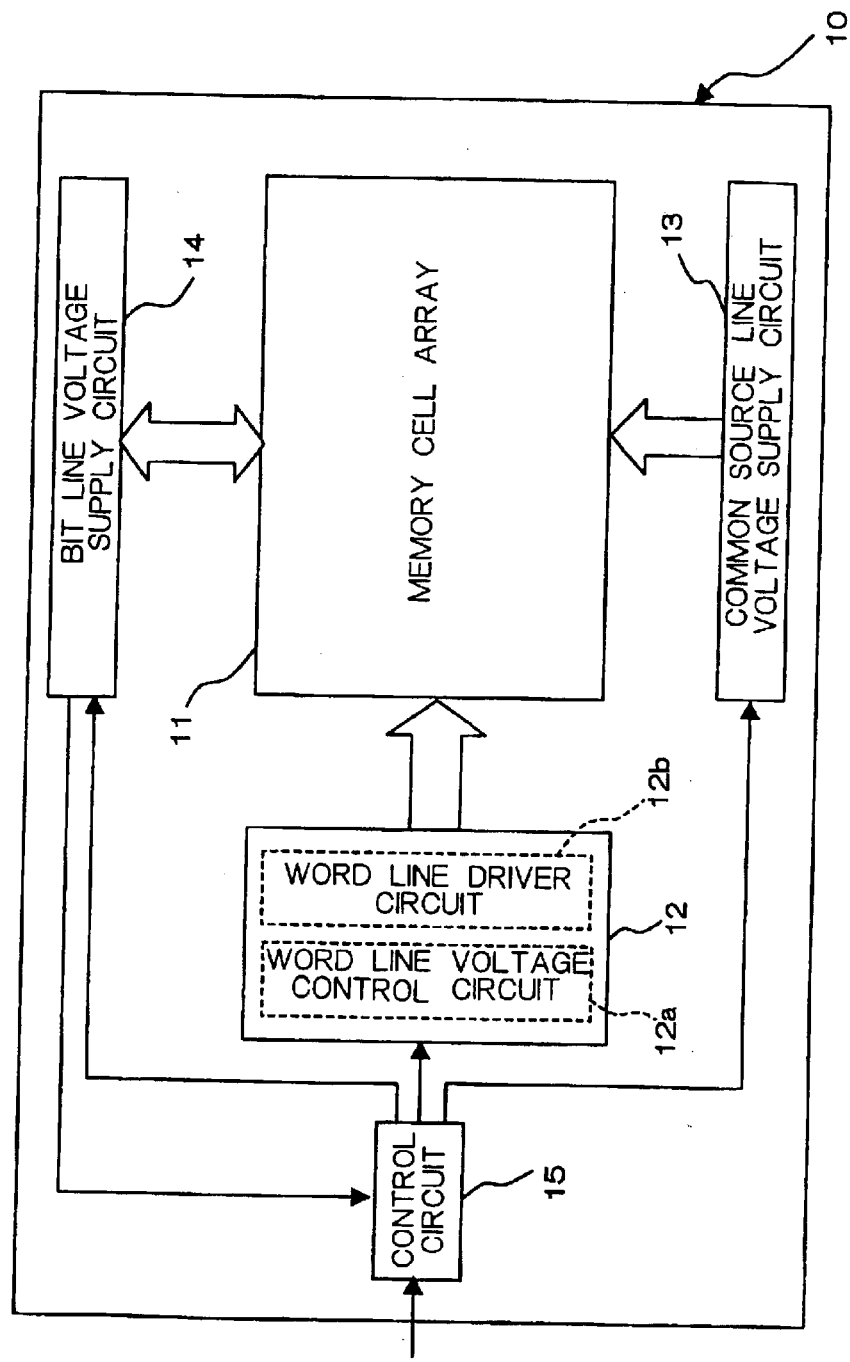
FIG. 1 is a block diagram showing a four-valued flash memory as a nonvolatile semiconductor memory device according to a first embodiment of the invention.

FIG. 1 is a block diagram showing a four-valued flash memory 10 as a nonvolatile semiconductor memory device according to a first embodiment of the invention. Here, description focuses on only points necessary for explanation of the present invention.

In FIG. 1, reference numeral 11 denotes a memory cell array. Reference numeral 12 denotes a word line voltage supply circuit, which supplies a voltage to a word line of the memory cell array 11. Reference numeral 13 denotes a common source line voltage supply circuit, which supplies a voltage to a common source line of the memory cell array 11. Reference numeral 14 denotes a bit line voltage supply circuit, which supplies a voltage to a bit line of the memory cell array 11. Reference numeral 15 denotes a control circuit that controls the word line voltage supply circuit 12, common source line voltage supply circuit 13 and bit line voltage supply circuit 14.

Figure 2:
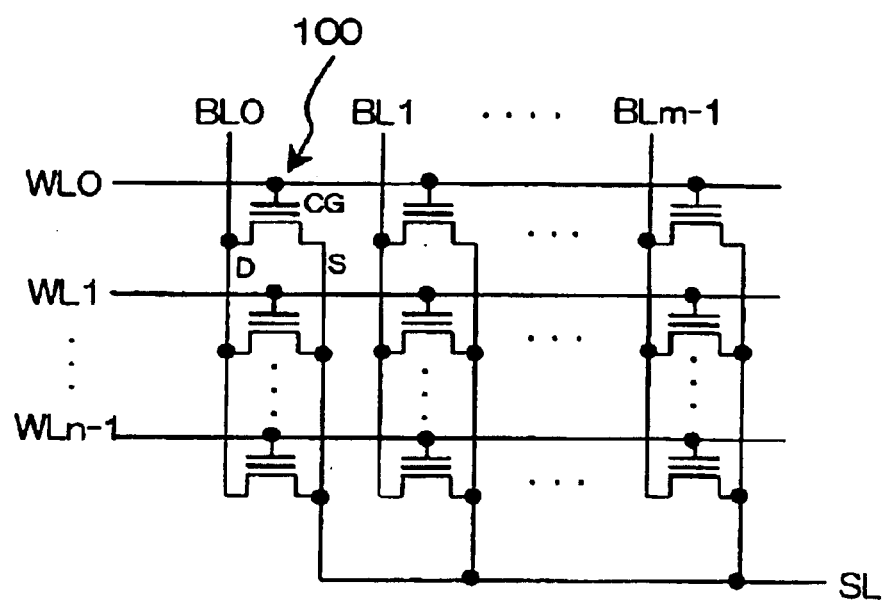
FIG. 2 is a circuit diagram showing one block of a memory cell array of the flash memory.

FIG. 2 shows a circuit diagram of one block of the memory cell array 11. Generally, a plurality of blocks constitute a memory cell array.

Figure 8:
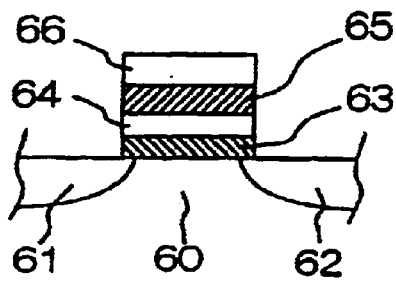
FIG. 8 is a view showing a cross-sectional structure of a flash memory as a conventional nonvolatile semiconductor memory device.
Figure 9:
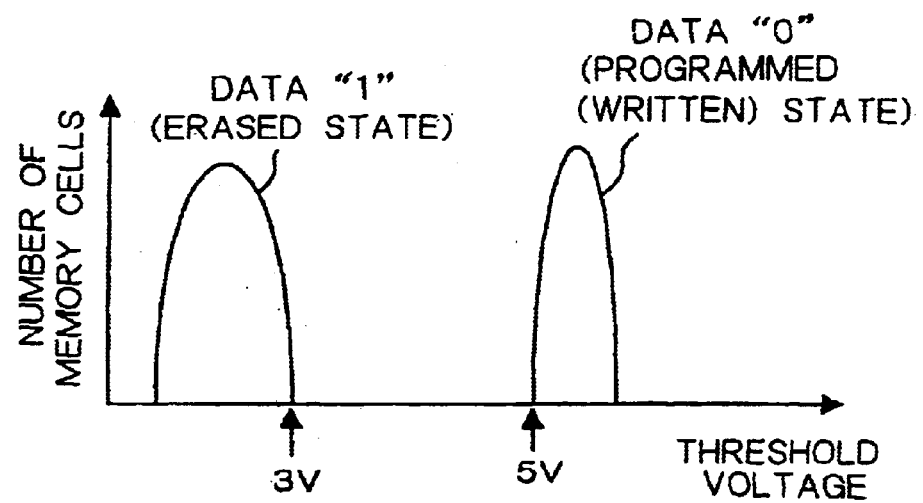
FIG. 9 is a view showing a threshold voltage state of a two-valued flash memory.
Figure 10A:
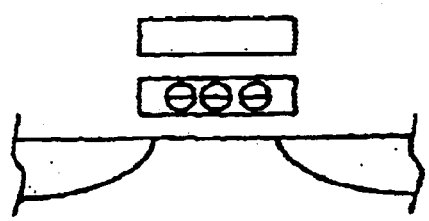
FIGS. 10A to 10D are views showing states of charges in a floating gate of a four-valued flash memory.
Figure 10B:
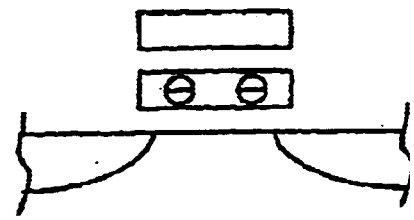
Figure 10C:
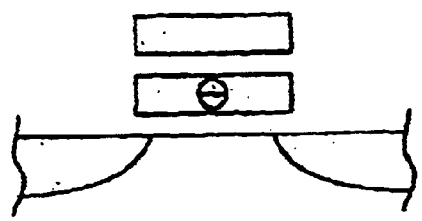
Figure 10D:
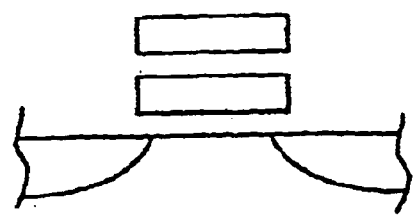

As shown in FIG. 2, a plurality of memory cells 100 are arranged in a matrix. Control gates of m memory cells 100 are connected to a word line WL0. Control gates of m memory cells 100 are similarly connected to word lines WL1 to WLn-1. Furthermore, drains of n memory cells 100 are connected to a bit line BL0, and drains of n memory cells 100 are similarly connected to bit lines BL1 to BLm-1. Furthermore, sources of the memory cells 100 in the same block are commonly connected to a common source line SL. Since the memory cell 100 has the same constitution as the memory cell in FIG. 8, its description is omitted.

It is noted that a reference memory cell used for comparison when whether a memory cell reaches a predetermined threshold voltage is verified in a verify operation performed at the time of a write or erase operation is included in the memory cell array 11 (shown in FIG. 1) in addition to a data region in which data is stored, but these are omitted.

In order to drive the word lines WL0 to WLn-1, the word line voltage supply circuit 12 shown in FIG. 1 is included. The word line voltage supply circuit 12 selects a word line based on a control signal and an address signal from the control circuit 15, and a voltage is raised to a program (write) voltage by a write control signal to drive the selected word line. Furthermore, the common source line voltage supply circuit 13 selects the common source line used commonly by the sources in the same block based on a control signal and an address signal from the control circuit 15, and raises an erase control signal to an erase voltage to drive the common source line. Furthermore, the bit line voltage supply circuit 14 selects a bit line of the data region memory cell array based on a control signal and an address signal from the control circuit 15, and raises a write/read control signal to drive the bit line.

It is noted that a comparison circuit, which verifies a threshold voltage by comparing memory cell currents that flow in a memory cell and a reference memory cell in a verify operation performed at the time of a write or erase operation and transmittes whether application of a write pulse or erase pulse is continued or stopped to the control circuit 15, a sense amplifier circuit, which converts a memory cell current to a voltage and senses the voltage at the time of a read operation, and so forth are included in the bit line voltage supply circuit 14, but these are not shown in FIG. 1.

Since the present invention relates to a multi-valued nonvolatile semiconductor memory device, and particularly relates to a control of a write voltage to a word line, the word line voltage supply circuit 12 is described in detain hereafter.

As shown in FIG. 1, the word line voltage supply circuit 12 is constituted by a word line voltage control circuit 12a as write means and a word line driver circuit 12b corresponding to each word line. Furthermore, the word line voltage control circuit 12a is constituted by control circuits that control and output voltages applied to a word line for write, erase and read operations, respectively. Here, the word line driver circuit 12b outputs a write pulse voltage from the word line voltage control circuit 12a to a word line at the time of a write operation, outputs an erase pulse from an erase control circuit (not shown) to a word line at the time of an erase operation, and selects an output from a read control circuit (not shown) and outputs it to a word line at the time of a read operation. Since this circuit is constituted by an existing switch circuit, detail description thereof is omitted here.

Figure 3:
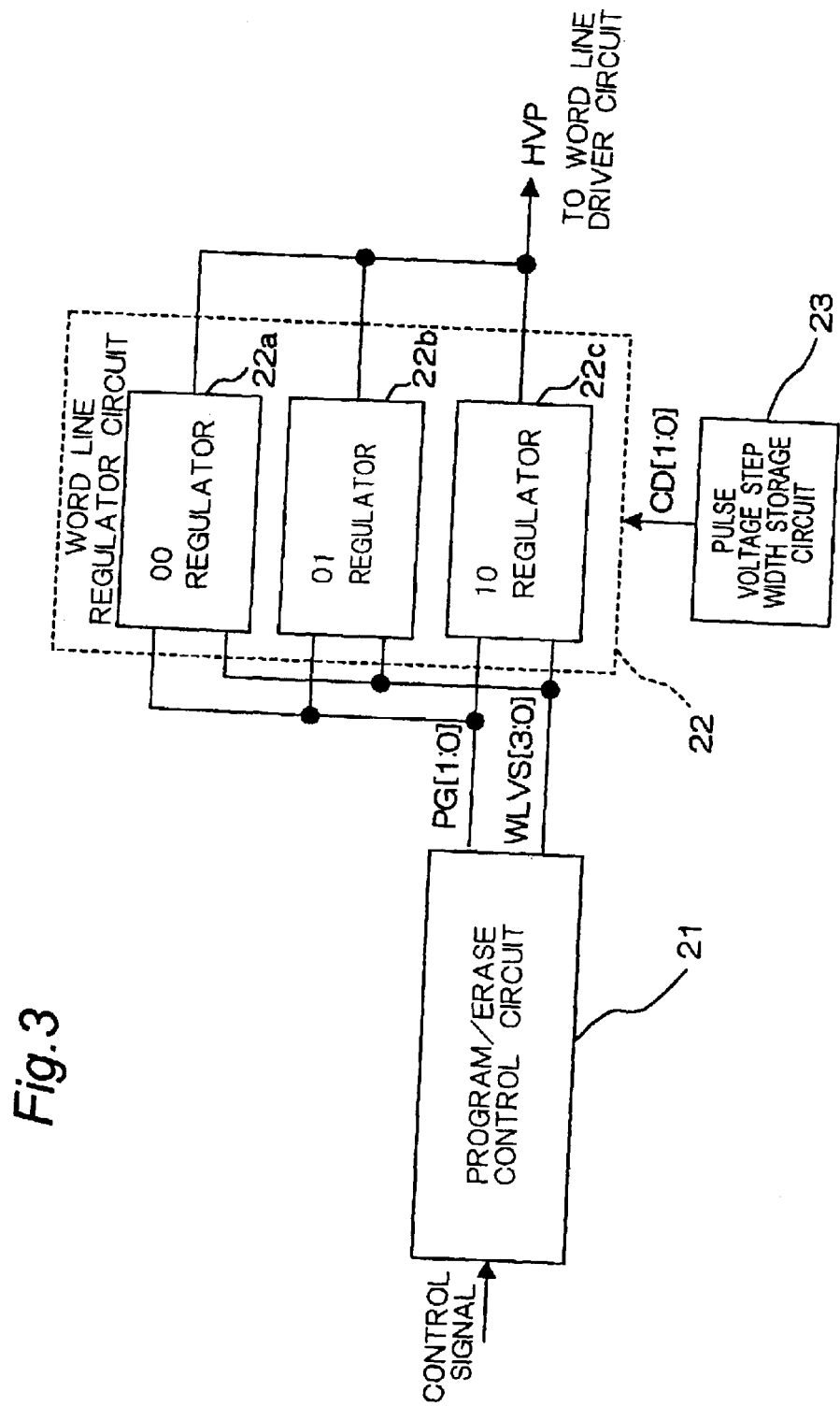
FIG. 3 is a schematic block diagram showing a word line voltage control circuit.

FIG. 3 is a schematic block diagram of the word line voltage control circuit (for a write operation). In FIG. 3, reference numeral 21 denotes a program/erase control circuit as write control means, which receives a control signal from the control circuit 15 (shown in FIG. 1). Reference numeral 22 denotes a word line regulator circuit as voltage supply means, which receives control signals WLVS [3:0] and PG [1:0] from the program/erase control circuit 21. Reference numeral 23 denotes a pulse voltage step width storage circuit as storage means, which outputs a selection control signal CD [1:0] to the word line regulator circuit 22. The control signal WLVS [3:0] represents four signals of WLVS3, WLVS2, WLVS1 and WLVS0. The control signal PG [1:0] represents two signals of PG1 and PG0. The selection control signal CD [1:0] represents two signals of CD1 and CD0.

Figure 13:
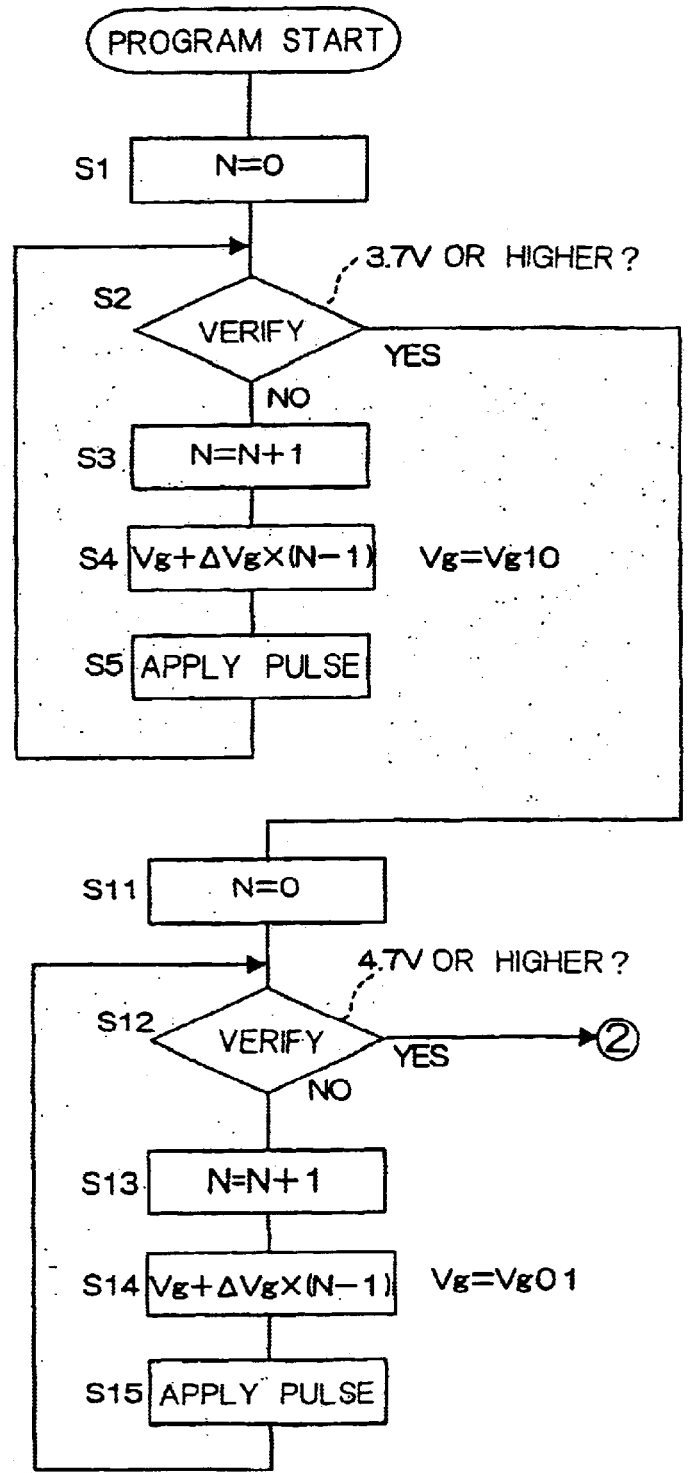
FIG. 13 is a flow chart for explaining a conventional program algorithm.
Figure 14:
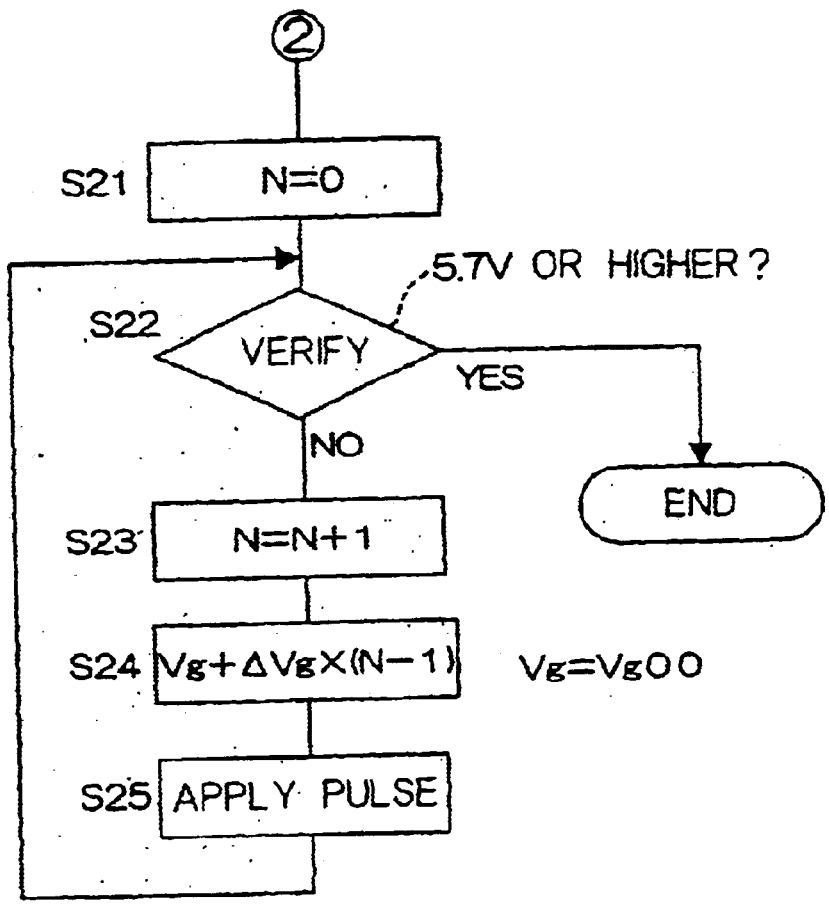
FIG. 14 is a flow chart following FIG. 13.
Figure 15:
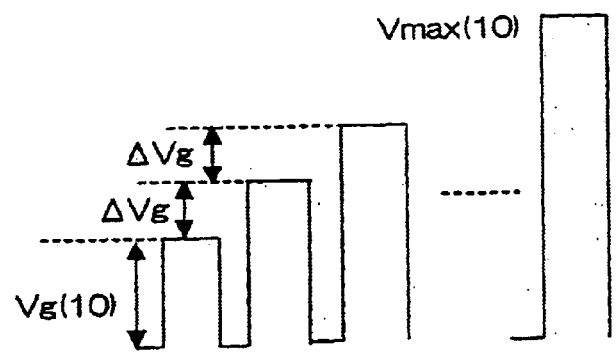
FIG. 15 is a transition diagram showing a word line voltage at the time of a write operation of data "10"
Figure 16:
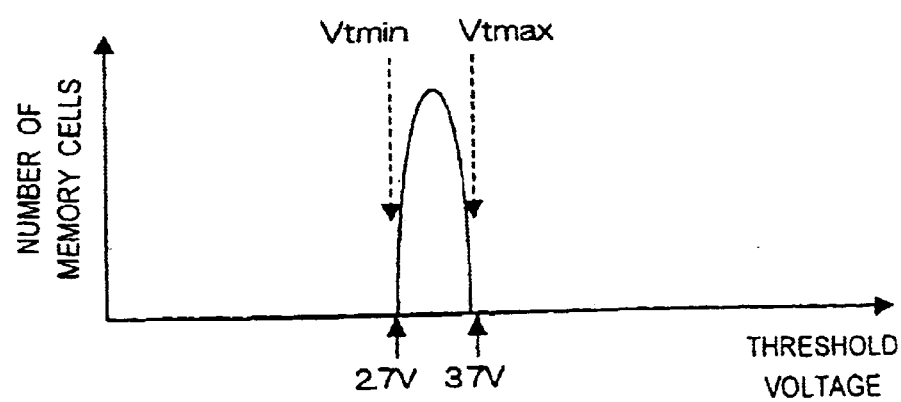
FIG. 16 is a view showing a distribution of threshold voltages immediately after one program pulse is applied.
Figure 17:
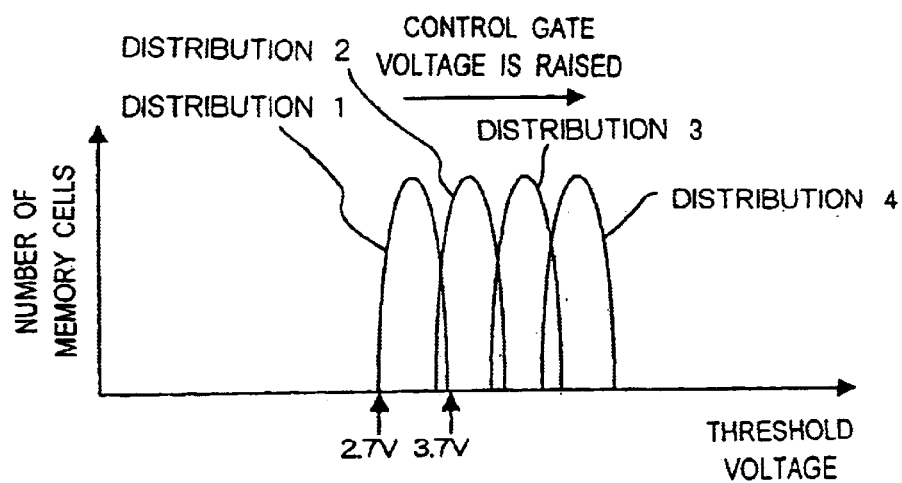
FIG. 17 is a view showing a distribution of threshold voltages when pulses are applied while changing a gate voltage.
Figure 18:
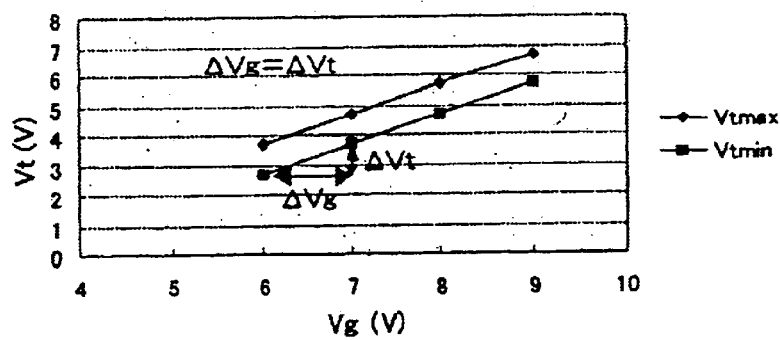
FIG. 18 is a view showing relations between a gate voltage and a lower limit threshold voltage Vtmin and an upper limit threshold voltage Vtmax after a program operation.

In the case of a multi-valued technique, a voltage applied to a word line at each step at the time of a write operation is determined by a control signal WLVS [3:0] from the program/erase control circuit 21 as shown in FIG. 3. Furthermore, a program algorithm is the same as the algorithm shown in the flow chart in FIG. 13 (however, a voltage increment $\Delta Vg$ is set in the pulse voltage step width storage circuit 23 in unites of devices based on results of evaluation of characteristics upon a wafer test of the devices).

The word line regulator circuit 22 in FIG. 3 is disposed for each word line WL0 to WLn-1, and connected to a word line via the word line driver circuit 12b (shown in FIG. 1). The word line regulator circuit 22 is constituted by a 00 regulator 22a, 01 regulator 22b and 10 regulator 22c.

The 00 regulator 22a is a circuit that generates a write pulse for writing data "00" The 01 regulator 22b is a circuit that generates a write pulse for writing data "01". The 10 regulator 22c is a circuit that generates a write pulse for writing data "10". One regulator is disposed in each word line. Since data "11" is in an erased state, an erase pulse is generated from another word line control circuit (for an erase operation), and outputted (for example, −9 V) to a word line via the word line driver circuit 12b (shown in FIG. 1). However, since the erase operation is performed in an ordinary circuit, description thereof is omitted here.

The program/erase control circuit 21 controls step application of a write pulse voltage (including stop of the application) based on verify results from the bit line voltage supply circuit 14 (shown in FIG. 1) at the time of a write operation, and controls a regulator to be used, prohibition of an output from an unused regulator depending on data "00" to "10" to be written, prohibition of outputs from all the regulators at the time of an erase operation, prohibition of an output from an unused regulator at the time of a verify operation and so forth.

The program/erase control circuit 21 includes control means for stepwise applying write pulses. Here, the control is performed by 4-bit control signals WLVS [3:0], and 0000 to 1111 can be outputted at maximum 16 steps. Here, 0000 is outputted at a first step, 0001 is outputted at a second step, 0010 is outputted at a third step, etc. Then, when it is determined that more steps are necessary depending on verify results, the output is continued while stepped up.

Further, here, a control signal PG [1:0] for determining a regulator to be used and prohibiting outputs from other regulators depending on data "00" to "10" is constituted by two bits (00, 01, 10), and controls three 00 regulators 22a, 01 regulator 22b and 10 regulator 22c.

Furthermore, information for determining a voltage increment $\Delta Vg$ at the time of a wafer test is written in the pulse voltage step width storage circuit 23 based on characteristic test results at a stage of a wafer. Furthermore, information for determining a voltage increment $\Delta Vg$ may be written in the pulse voltage step width storage circuit 23 based on test results of a packaged device (in this case, a terminal for inputting the characteristic test results is required).

Thus, test results are stored so that a voltage increment $\Delta Vg$ matching the characteristic can be generated for each device.

It is sufficient that the pulse voltage step width storage circuit 23 is constituted by a flash memory, and that part of memory cells in a memory cell array or surrounding the memory cell array are used. Since no storage means needs to be newly designed, a chip area is not increased.

In this four-valued flash memory, maximum four conditions can be used by the 2-bit selection control signal CD [1:0] from the pulse voltage step width storage circuit 23.

Here, the flash memory is described assuming that, when $\Delta Vt=\Delta Vg$, the selection control signal CD [1:0] is set at 00, that, when $\Delta Vt>\Delta Vg$, the selection control signal CD [1:0] is set at 01, and that, when $\Delta Vt<\Delta Vg$, the selection control signal CD [1:0] is set at 10.

Furthermore, in the word line regulator circuit 22, when each threshold voltage is applied, that is, data "00", data "01" or data "10" is programmed (written), the 00 regulator 22a, 01 regulator 22b or 10 regulator 22c, respectively, becomes active.

Figure 4:
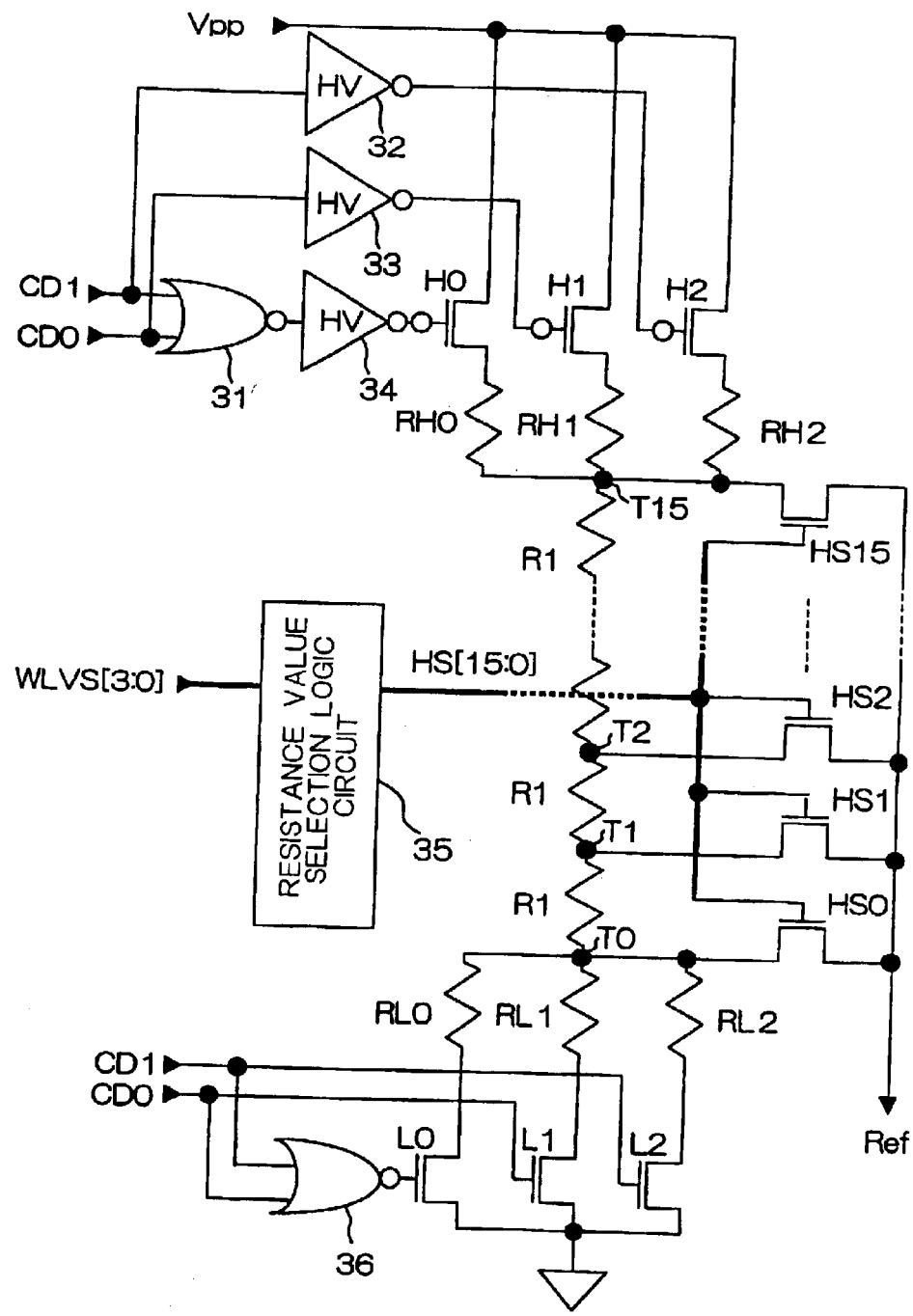
FIG. 4 is a circuit diagram showing a regulator of a word line regulator circuit of the word line voltage control circuit.
Figure 5:
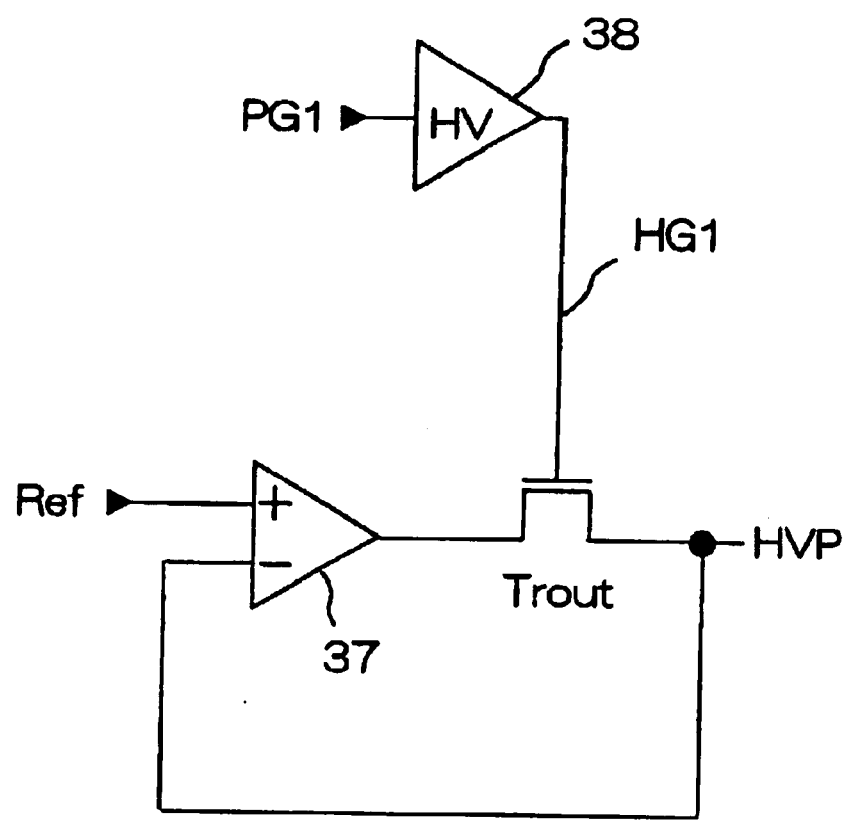
FIG. 5 is a circuit diagram showing part of the regulator.

FIGS. 4 and 5 are detailed circuit diagrams showing regulators in the word line voltage control circuit (for a write operation) shown in FIG. 3. In FIG. 4, circuit structures of the three regulators are basically the same except for resistance values.

As shown in FIG. 4, selection control signals CD0, CD1 are inputted to an input terminal of a NOR circuit 31, and an output terminal of the NOR circuit 31 is connected to an input terminal of a level shift circuit 34. An output terminal of the level shift circuit 34 is connected to a gate of a pMOS transistor H0. Furthermore, the selection control signal CD0 is connected to an input terminal of a level shift circuit 33, and an output terminal of the level shift circuit 33 is connected to a gate of a pMOS transistor H1. Furthermore, the selection control signal CD1 is connected to an input terminal of a level shift circuit 32, and an output terminal of the level shift circuit 32 is connected to a gate of a pMOS transistor H2. Each source of the pMOS transistors H0, H1, H2 is connected to a power source Vpp, a drain of the pMOS transistor H0 is connected to a terminal T15 via a resistor RH0, a drain of the pMOS transistor H1 is connected to the terminal T15 via a resistor RH1, and a drain of the PMOS transistor H2 is connected to the terminal T15 via a resistor RH2. Fifteen resistors R1 are connected to the terminal T15 in series, connection points of the resistors R1 connected in series are designated as terminals T14 to T1 from the terminal T15 side, and an end is designated as terminal T0. The level shift circuits 32–34 are inverter-type level shift circuits for raising a voltage. An input power source Vcc level as a High level is raised to a Vpp level (for example, 12 V), which is a high voltage level.

Furthermore, selection control signals CD0, CD1 are inputted to an input terminal of a NOR circuit 36, and an output terminal of the NOR circuit 36 is connected to a gate of an nMOS transistor L0. Furthermore, the selection control signal CD0 is inputted to a gate of an nMOS transistor L1, and the selection control signal CD1 is inputted to a gate of an nMOS transistor L2. Sources of the nMOS transistors L0, L1, L2 are connected to ground, a drain of the nMOS transistor L0 is connected to the terminal T0 via a resistor RL0, a drain of the nMOS transistor L1 is connected to the terminal T0 via a resistor RL1, and a drain of the nMOS transistor L2 is connected to the terminal T0 via a resistor RL2.

Subsequently, a drain of an nMOS transistor HS15 is connected to the terminal T15, and, similarly, drains of nMOS transistors HS14 to HS0 are connected to the terminals T14 to T0, respectively. Sources of the nMOS transistors HS15 to HS0 are commonly connected. Furthermore, a control signal WLVS [3:0] from the program/erase control circuit 21 shown in FIG. 3 is inputted to a resistance value selection logic circuit 35, and a control signal HS [15:0] outputted from the resistance value selection logic circuit 35 is inputted to the gate of each of the nMOS transistors HS15 to HS0.

Subsequently, a Ref signal outputted from the common source of the nMOS transistors HS15–HS0 is inputted to a cathode-side input terminal of an amplifier 37 as shown in FIG. 5, an output terminal of the amplifier 37 is connected to a drain of an nMOS transistor Trout, and a source of the nMOS transistor Trout is connected to an anode-side input terminal of the amplifier 37 to form a voltage follower circuit. A control signal. PG1 from the program/erase control circuit 21 is inputted to a level shift circuit 38, and an output signal HG1 of the level shift circuit 38 is inputted to a gate of the nMOS transistor Trout.

The regulators having the above constitution are explained first with the 10 regulator 22c for writing data "10".

When a selection control signal CD [1:0] from the pulse voltage step width storage circuit 23 (shown in FIG. 3) is 00 (CD1 is 0, and CD0 is 0), the pMOS transistor H0 and the nMOS transistor L0 are turned on, and a current is allowed to flow via the resistors RH0, R1, . . . , R1, RL0. Furthermore, when a selection control signal CD [1:0] is 01 (CD1 is 0, and CD0 is 1), the pMOS transistor H1 and nMOS transistor L1 are turned on, and a current is allowed to flow via the resistors RH1, R1, . . . , R1, RL1. Furthermore, when a selection control signal CD [1:0] is 10 (CD1 is 1, and CD0 is 0), the pMOS transistor H2 and nMOS transistor L2 are turned on, and a current is allowed to flow via the resistors RH2, R1, . . . , R1, RL2. Thus, by making resistance values of the resistors RH0–RH2, RL0–RL2 different, different voltage increments ΔVg can be set.

The resistance value selection logic circuit 35 is a decoder that decodes a control signal WLVS to 0–15 depending on its 4-bit data, and can be easily made up of an ordinary circuit. For example, when a control signal WLVS [3:0] is 0000, an nMOS transistor HS0 is turned on. When a control signal WLVS [3:0] is 0001, an nMOS transistor HS1 is turned on. When a control signal WLVS [3:0] is 0010, an nMOS transistor HS2 is turned on. Thereafter, similarly, nMOS transistors are selected, and, when a control signal WLVS [3:0] is 1111, an nMOS transistor HS15 is turned on, and one output is selected depending on the control signal WLVS [3:0] and outputted as a Ref voltage.

Furthermore, a difference between outputs of the adjacent terminals T0–T15 becomes a voltage increment ΔVg, and the voltage increment ΔVg can be made different by the selection control signal CD [1:0] by setting different resistance values for the resistors RH0–RH2, RL0–RL2.

The Ref voltage is inputted to the cathode-side input terminal of the amplifier 37 constituting the voltage follower circuit shown in FIG. 5 to obtain lower impedance and outputted to the word line driver circuit 12b (shown in FIG. 1) as an output HVP. The nMOS transistor Trout is set at an output stage of the voltage follower circuit, and, when the word line regulator 22 is not used at the time of a write, erase or verify operation, the MOS transistor Trout is turned off by the control signal PG1, and the output is left open.

Then, in the case where ΔVt=ΔVg is satisfied when a program (write) is started, a selection control signal CD [1:0] of 00 is outputted from the pulse voltage step width storage circuit 23 (shown in FIG. 3), and, as a result, the resistors RH0 (15 kΩ) and RL0 (30 kΩ) become active. Furthermore, when data "10" is written, the control signal PG [1:0] becomes a High state, an output signal HG1 of the level shift circuit 38 becomes Vpp (12 V), and the 10 regulator 22c becomes active. Furthermore, a control signal WLVS [3:0] becomes 0000, the transistor HS0 is turned on, and the Ref voltage becomes 6 V. As a result, 6 V is set as a start voltage (write start voltage), 6 V is outputted to a word line to which a control gate of a memory cell to be programmed (written) is connected, a voltage of 5 V is outputted to a drain of the memory cell to be programmed (written), data is written, and a threshold voltage of the memory cell is raised.

Subsequently, a verify operation is performed, a drain of a memory cell having a threshold voltage of 3.7 V or higher is opened upon subsequent pulse application, and a drain voltage is not outputted. On the other hand, when a memory cell having a threshold voltage of 3.7 V or lower exists, the control signal WLVS [3:0] is changed to 0001, the transistor HS1 is turned on, and the Ref voltage becomes 6.3 V. As a result, 6.3 V is outputted to a word line, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, a word line voltage is verified, and then the control signal WLVS [3:0] is incremented to perform a program pulse application. These verify operation and program pulse application are repeated until there is no memory cell having a threshold voltage of 3.7 V or lower.

Furthermore, when data "01" or data "00" (threshold voltage is 4.7 to 5 V or 5.1 V or higher) exists, an operation for making the threshold voltage 4.7 V or higher is subsequently performed. In this case, the 01 regulator 22c is made active. As described above, the threshold voltage is raised to a range of 4.7 to 5 V by the same procedure. Furthermore, with data "00", the 00 regulator 22a is made active, and the threshold voltage is similarly made 5.7 V or higher.

As described above, data "10" requiring a low threshold voltage is written first. When it is finished, data "01" is subsequently written. Then, data "00" requiring a higher threshold voltage is further written.

The case where characteristics of memory cells vary is described below.

[(1) When ΔVt>ΔVg]

For example, when ΔVt=1.2×ΔVg, a voltage increment ΔVg needs to be 0.25 V to make a threshold voltage change ΔVt 0.3 V. In this case, characteristics of memory cells of this chip are measured by a wafer test or the like, information showing that a voltage increment ΔVg is 0.25 V is stored in the pulse voltage step width storage circuit 23 (shown in FIG. 3). In this case, information is stored so that a selection control signal CD [1:0]=01 is outputted, and, when a program is started, the resistor RL1 (36.1 kΩ) and the resistor RH1 (16.1 kΩ) are selected. First, a control signal WLVS [3:0] becomes 0000, the transistor HS0 is turned on, and the Ref voltage becomes 6 V. As a result, 6 V is set as a start voltage, 6 V is outputted to a word line to which a control gate of a memory cell to be programmed (written) is connected, a voltage of 5 V is outputted to a drain of the memory cell to be programmed (written), data is written to its memory cell, and its threshold voltage is raised.

Subsequently, a verify operation is performed, and a drain voltage is not outputted to a memory cell having a threshold voltage of 3.7 V or higher upon a subsequent pulse application. On the other hand, when a memory cell having a threshold voltage of 3.7 V or lower exists, the control signal WLVS [3:0] becomes 0001, the transistor HS1 is turned on, and the Ref voltage becomes 6.25 V. As a result, 6.25 V is outputted as a word line voltage, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, the control signal WLVS [3:0] is raised to perform program pulse application. These verify operation and program pulse application are repeated until there is no memory cell having a threshold voltage of 3.7 V or lower.

Furthermore, when data "01" or data "00" (threshold voltage is 4.7 to 5 V or 5.7 V or higher) exists, an operation for making the threshold voltage 4.7 V or higher is subsequently performed. In this case, the 01 regulator 22c is made active. Thus, the threshold voltage is raised to a range of 4.7 to 5 V by the same procedure. Furthermore, with data "00", the 00 regulator 22a is made active, and the threshold voltage is similarly made 5.7 V or higher.

This operation is the same as in the case of ΔVt=ΔVg described above.

[(2) When ΔVt<ΔVg]

For example, when ΔVt=0.8×ΔVg, a voltage increment ΔVg needs to be 0.375 V to make a threshold voltage change ΔVt 0.3 V. In this case, characteristics of memory cells of this chip are measured by a wafer test or the like, information showing that a voltage increment ΔVg is 0.375 V is stored in the pulse voltage step width storage circuit 23 (shown in FIG. 3). In this case, the information is stored so that a selection control signal CD [1:0]=10 is outputted, and, when a program is started, the resistor RL2 (24 kΩ) and the resistor RH2 (9 kΩ) are selected.

Furthermore, a control signal WLVS [3:0] becomes 0000, the transistor HS0 is turned on, and the Ref voltage becomes 6 V. As a result, 6 V is set as a start voltage, 6 V is outputted to a word line to which a memory cell to be programmed (written) is connected, a voltage of 5 V is outputted to a drain of the memory cell to be programmed (written), data is written to the memory cell, and its threshold voltage is raised.

Subsequently, a verify operation is performed, and a drain voltage is not outputted to a memory cell having a threshold voltage of 3.7 V or higher upon a subsequent pulse application. On the other hand, when a memory cell having a threshold voltage of 3.7 V or lower exists, the control signal WLVS [3:0] is changed to 0001, the transistor HS1 is turned on, and the Ref voltage becomes 6.375 V. As a result, 6.375 V is outputted as a word line voltage, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, a control signal WLVS [3:0] is incremented to perform program pulse application. These verify operation and program pulse application are repeated until there is no memory cell having a threshold voltage of 3.7 V or lower.

Furthermore, when data "01" or data "00" (threshold voltage is 4.7 to 5 V or 5.7 V or higher) exists, an operation for making the threshold voltage 4.7 V or higher is subsequently performed. In this case, the 01 regulator 22c is made active. Thus, the threshold voltage is raised to a range of 4.7 to 5 V by the same procedure. Furthermore, with data "00", the 00 regulator 22a is made active, and the threshold voltage is similarly made 5.7 V or higher.

Thus, in a four-valued flash memory as the nonvolatile semiconductor memory device of the first embodiment, by changing voltage increments ΔVg depending on write characteristics of memory cells of the devices, shift amount of a threshold voltage of a memory cell by one pulse can be made about 0.3 V for all chips, deterioration of a write speed can be prevented, a read margin can be secured, and reliability can be improved.

Furthermore, since a voltage increment ΔVg reflecting test results can be set, reliability can be improved.

Second Embodiment

Figure 6:
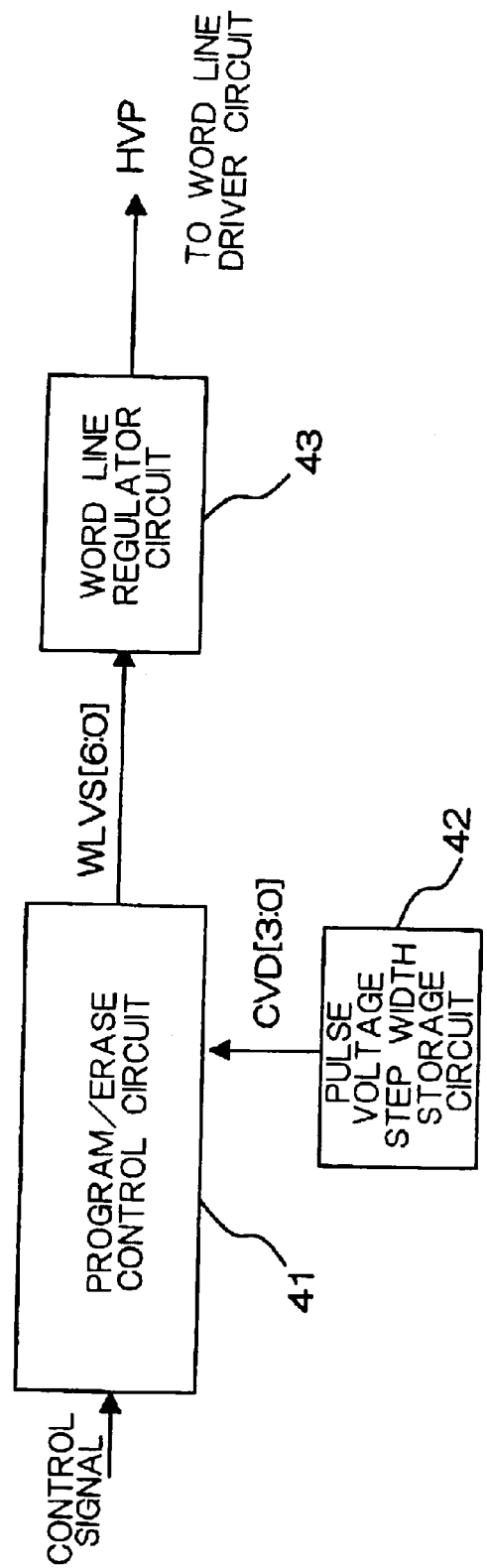
FIG. 6 is a schematic block diagram showing a word line voltage control circuit of a flash memory as a nonvolatile semiconductor memory device according to a second embodiment of the invention.

FIG. 6 is a schematic block diagram showing a word line voltage control circuit (for a write operation) used for a four-valued flash memory as a nonvolatile semiconductor memory device according to a second embodiment of the invention. A word line output voltage of 6 to 9.175 V can be outputted in units of 0.025 V from the word line voltage control circuit. In FIG. 6, reference numeral 41 denotes a program/erase control circuit as write control means. Reference numeral 42 denotes a pulse voltage step width storage circuit as storage means, which outputs a selection control signal CVD [3:0] to the program/erase control circuit 41. Reference numeral 43 denotes a word line regulator circuit as voltage supply means, which receives a control signal WLVS [3:0] from the program/erase control circuit 41. The control signals WLVS [6:0] represents seven signals of WLVS6, WLVS5, . . . , WLVS1 and WLVS0, and the selection control signal CVD [3:0] represents four signals of CVD3, . . . , CVD0.

Figure 7:
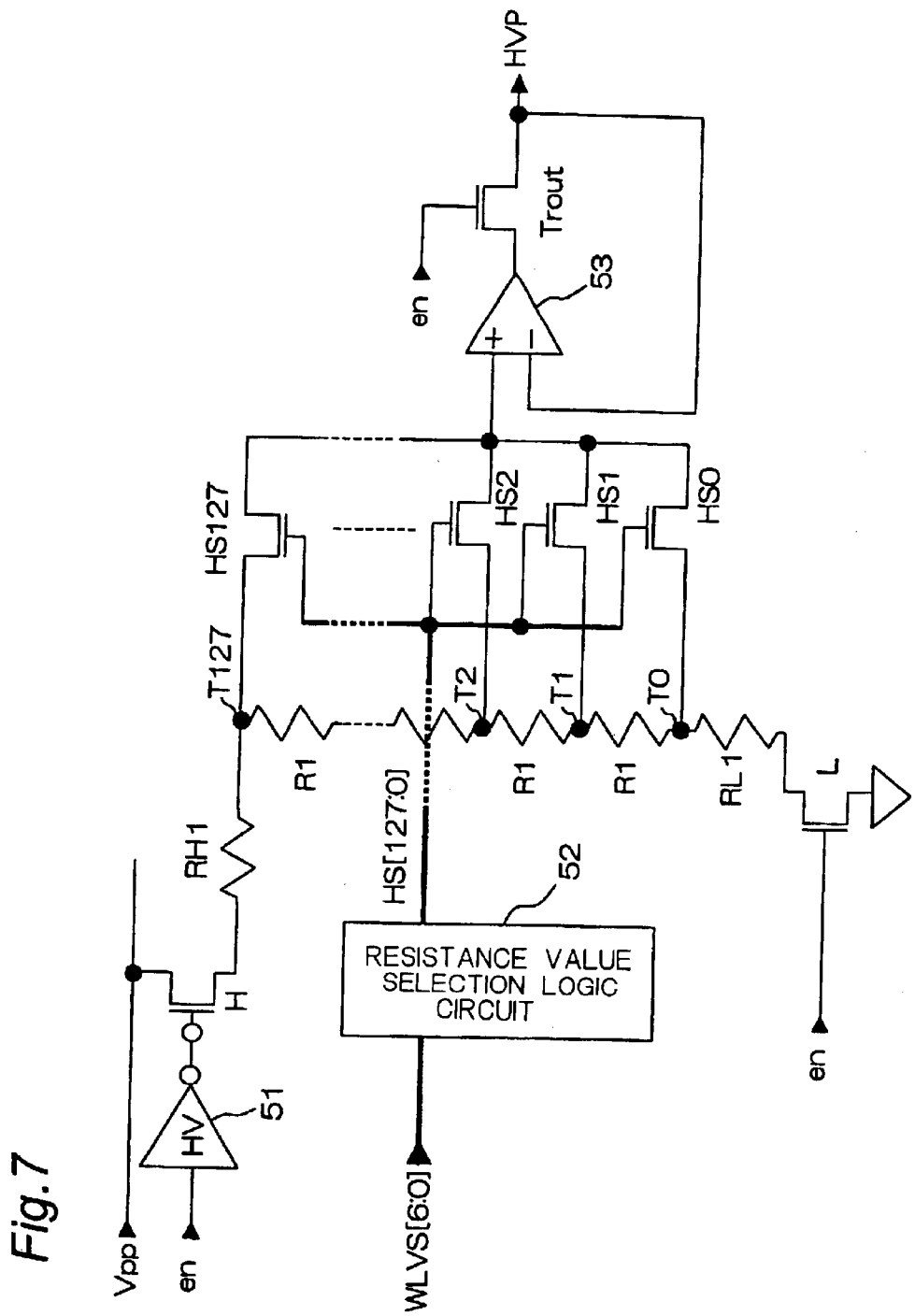
FIG. 7 is a circuit diagram showing a word line regulator circuit of the word line voltage control circuit.

Furthermore, FIG. 7 is a detailed circuit diagram showing a word line regulator circuit in the word line voltage control circuit (for a write operation) shown in FIG. 6.

As shown in FIG. 7, a control signal en is inputted to an input terminal of a level shift circuit 51, and an output terminal of the level shift circuit 51 is connected to a gate of a pMOS transistor H. A source of the pMOS transistor H is connected to a power source Vpp (for example, 12 V), a drain of the PMOS transistor H is connected to a terminal T127 via a resistor RH1. One hundred twenty six resistors R1 are connected to the terminal T127 in series. Connection points of the resistors R1 connected in series are designated as terminals T126 to T1 from the terminal T127 side, and an end is designated as terminal T0. The level shift circuit 51 is an inverter-type level shift circuit for raising a voltage, which is the same as in the first embodiment.

Furthermore, the control signal en is inputted to a gate of an nMOS transistor L. A source of the nMOS transistor L is connected to ground, and a drain of the nMOS transistor L is connected to the terminal T0 via a resistor RL1.

Subsequently, a drain of an nMOS transistor HS127 is connected to the terminal T127, and, similarly, drains of nMOS transistors HS126–HS0 are connected to the terminals T126–T0, respectively. Sources of the nMOS transistors HS127–HS0 are commonly connected. Furthermore, a control signal WLVS [6:0] from the program/erase control circuit 41 shown in FIG. 6 is inputted to a resistance value selection logic circuit 52, and a control signal HS [127:0] outputted from the resistance value selection logic circuit 52 is inputted to each of gates of nMOS transistors HS127–HS0.

Subsequently, a Ref signal outputted from the common source of the nMOS transistors HS127–HS0 is inputted to a cathode-side input terminal of an amplifier 53, and an output terminal of the amplifier 53 is connected to a drain of an nMOS transistor Trout. A source of the nMOS transistor Trout is connected to an anode-side input terminal of the amplifier 53 to form a voltage follower circuit. Then, a control signal en is inputted to a gate of the nMOS transistor Trout.

In the flash memory of the second embodiment, 127 resistors R1 are connected in series, and the 00 regulator 22a, 01 regulator 22b and 10 regulator 22c of the first embodiment shown in FIG. 3 are integrated into one word line regulator circuit 43 by setting a voltage difference between both ends of a resistor R1 fine at 0.025 V.

First, in the word line regulator circuit 43, as shown in FIG. 7, the resistor RH1, the resistor RL1 and 127 resistors R1 are connected in series, and the terminals T0–T127 of connection points of the resistors R1 are Ref voltage nodes connected via the nMOS transistors HS0–HS127.

The Ref voltage is inputted to a cathode-side input terminal of the amplifier 53 constituting a voltage follower circuit to obtain lower impedance and outputted to a word line driver circuit (not shown) as a signal HVP. Furthermore, the control signal en is a write pulse control signal, and becomes a High level when a write pulse is outputted. The nMOS transistor Trout located at an output stage of the voltage follower circuit is turned on when the control signal en is at a High level and outputs the Ref voltage, and becomes an open state when the control signal en is a Low level.

Furthermore, the resistance value selection logic circuit 52 is a decoder that receives a 7-bit control signal WLVS [6:0] from the program/erase control circuit 41 (shown in FIG. 6) and decodes it to any one of control signals HS0–127 depending on the 7-bit control signal.

The resistance value selection logic circuit 52 can be made up of ordinary circuits as in the above first embodiment.

Table 2 shows relations of control signals WLVS [6:0], transistors to be turned on among nMOS transistors HS0–HS127 and Ref voltages.

TABLE 2

| WLVS (7 bits) | Transistor to be turned on | Ref voltage |
| --- | --- | --- |
| 0000000 | HS0 | 6.000 V |
| 0000001 | HS1 | 6.025 V |
| 0000010 | HS2 | 6.050 V |
| 0000011 | HS3 | 6.075 V |
| 0000100 | HS4 | 6.100 V |
| 0000101 | HS5 | 6.125 V |
| 0000110 | HS6 | 6.150 V |
| 0000111 | HS7 | 6.175 V |
| 0001000 | HS8 | 6.200 V |
| \| | \| | \| |
| 0001010 | HS10 | 6.250 V |
| \| | \| | \| |
| 0001100 | HS12 | 6.300 V |
| \| | \| | \| |
| 0001111 | HS15 | 6.375 V |
| \| | \| | \| |
| 1111111 | HS127 | 9.175 V |

Consequently, in the pulse voltage step width storage circuit 42, a value to be used as a voltage increment $\Delta Vg$ is converted to bits and stored. The time of storage is the same as in the first embodiment. The number of bits required for storage in the pulse voltage step width storage circuit 42 is determined by a relation between a voltage difference set by resistance in series of the resistors R1 and an assumed voltage increment $\Delta Vg$. In this second embodiment, values are stored in 4 bits. Table 3 shows relations between selection control signals CVD [3:0] and voltage increments $\Delta Vg$.

TABLE 3

| CVD [3:0] | Voltage increment $\Delta Vg$ |
| --- | --- |
| 1001 | 0.225 |
| 1010 | 0.25 |
| 1011 | 0.275 |
| 1100 | 0.3 |
| 1101 | 0.325 |
| 1110 | 0.35 |
| 1111 | 0.375 |

For example, when a voltage increment $\Delta Vg$ is set at 0.3 V, it is sufficient to use a value stepped up by successively adding 1100 (actually, 0001100) to a value of a control signal WLVS [3:0] 0000000 thereafter. Furthermore, when a voltage increment $\Delta Vg$ is set at 0.25 V, it is sufficient to use a value stepped up by successively adding 1010 (actually, 0001010) to a value of a control signal WLVS 0000000 thereafter. Furthermore, when a voltage increment $\Delta Vg$ is set at 0.375 V, it is sufficient to use a value stepped up by successively adding 1111 (actually, 0001111) to a value of a control signal WLVS [6:0] 0000000 thereafter.

As shown in FIG. 6, the pulse voltage step width storage circuit 42 is directly connected to the program/erase control circuit 41 and not connected to the word line regulator circuit 43.

When a program (write) operation is started, and $\Delta Vt = \Delta Vg$ is satisfied, 1100 is outputted as a selection control signal CVD [3:0] from the pulse voltage step width storage circuit 42, the control signal WLVS [6:0] first becomes 0000000, the transistor HS0 is turned on, and the Ref voltage becomes 6 V. As a result, 6 V is set as a start voltage (write start voltage), 6 V is outputted to a word line to which a memory cell to be programmed (written) is connected, 5 V is outputted to a drain of the memory cell to be programmed (written), data is written, and a threshold voltage of the memory cell is raised.

Subsequently, a verify operation is performed, and a drain voltage is not outputted to a memory cell having a threshold voltage of 3.7 V or higher upon a subsequent pulse application. On the other hand, when a memory cell having a threshold voltage of 3.7 V or lower exists, 1100 is added to a control signal WLVS [6:0] to obtain 0001100, the transistor HS12 is turned on, and the Ref voltage becomes 6.3 V. As a result, 6.3 V is outputted to a word line, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, 1100 is further added to the control signal WLVS [6:0], and the transistor HS24 is turned on. Thereafter, similarly, the control signal WLVS [6:0] is raised to perform program pulse application. These verify operation and program pulse application are repeated until there is no memory cell having a threshold voltage of 3.7 V or lower.

Furthermore, when data "01" or data "00" (threshold voltage is 4.7 to 5 V or 5.7 V or higher) exists, an operation for making the threshold voltage 4.7 V or higher is subsequently performed. The threshold voltage is raised to a range of 4.7 to 5 V by the same procedure. Furthermore, with data "00", the threshold voltage is similarly made 5.7 V or higher.

The case where characteristics of memory cells vary is described below.

[(1) When $\Delta Vt > \Delta Vg$]

For example, when $\Delta Vt = 1.2 \times \Delta Vg$, a voltage increment $\Delta Vg = 0.25$ V is required to make a threshold voltage change $\Delta Vt$ 0.3 V. In this case, characteristics of memory cells of this chip are measured by a wafer test or the like, and information showing that a voltage increment $\Delta Vg$ is 0.25 V is stored in the pulse voltage step width storage circuit 42. In this case, information is stored so that CVD [3:0]=1010 is outputted.

First, a control signal WLVS [6:0] becomes 0000000, the transistor HS0 is turned on, and a Ref voltage becomes 6 V. As a result, 6 V is set as a start voltage, 6 V is outputted to a word line to which a memory cell to be programmed (written) is connected, 5 V is outputted to a drain of the memory cell to be programmed (written), data is written, and a threshold voltage of the memory cell is raised.

Subsequently, a verify operation is performed, and a drain voltage is not outputted to a memory cell having a threshold voltage of 3.7 V or higher upon a subsequent pulse application. On the other hand, when a memory cell having a threshold voltage of 3.7 V or lower exists, a control signal WLVS [6:0] becomes 0001010, the transistor HS10 is turned on, and the Ref voltage becomes 6.25 V. As a result, 6.25 V is outputted as a word line voltage, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, 1010 is further added to the control signal WLVS [6:0], and the transistor HS20 is turned on. Thereafter, similarly, the control signal WLVS [6:0] is raised to perform program pulse application. These verify operation and program pulse application are repeated until there is no memory cell having a threshold voltage of 3.7 V or lower.

Furthermore, when data "01" or data "00" (threshold voltage is 4.7 to 5 V or 5.7 V or higher) exists, an operation for making the threshold voltage 4.7 V or higher is subsequently performed, Thus, the threshold voltage is raised to a range of 4.7 to 5 V by the same procedure. Furthermore, with data "00", the threshold voltage is similarly made 5.7 V or higher.

[(2) When $\Delta Vt < \Delta Vg$]

For example, when $\Delta Vt = 0.8 \times \Delta Vg$, a voltage increment $\Delta Vg = 0.375$ V is required to make a threshold voltage change $\Delta Vt$ 0.3 V. In this case, characteristics of memory cells of this chip are measured by a wafer test or the like, and information showing that a voltage increment $\Delta Vg$ is 0.375 V is stored in the pulse voltage step width storage circuit 42. In this case, information is stored so that CVD [3:0]=1111 is outputted.

Furthermore, a control signal WLVS [6:0] becomes 0000000, the transistor HS0 is turned on, and a Ref voltage becomes 6 V. As a result, 6 V is set as a start voltage, 6 V is outputted to a word line to which a memory cell to be programmed (written) is connected, 5 V is outputted to a drain of the memory cell to be programmed (written), data is written, and a threshold voltage of the memory cell is raised.

Subsequently, a verify operation is performed, and a drain voltage is not outputted to a memory cell having a threshold voltage of 3.7 V or higher upon a subsequent pulse application. On the other hand, when a memory cell having a threshold voltage of 3.7 V or lower exists, 1111 is further added to a control signal WLVS [6:0], and the transistor HS30 is turned on. Thereafter, similarly, the control signal WLVS [6:0] becomes 0001111, the transistor HS15 is turned on, and the Ref voltage becomes 6.375 V. As a result, 6.375 V is outputted as a word line voltage, and a program (write) operation is performed.

Subsequently, a verify operation is performed, whether a threshold voltage of a memory cell is 3.7 V or higher is confirmed, and program pulse application (drain voltage application) to a memory cell having a threshold voltage of 3.7 V or higher is terminated then. If a memory cell having a threshold voltage of 3.7 V or lower exists, the control signal WLVS [6:0] is raised to perform program pulse application. These verify operation and program pulse application are repeated until there is no memory cell having a threshold voltage of 3.7 V or lower.

Furthermore, when data "01" or data "00" (threshold voltage is 4.7 to 5 V or 5.7 V or higher) exists, an operation for making the threshold voltage 4.7 V or higher is subsequently performed. Thus, the threshold voltage is raised to a range of 4.7 to 5 V by the same procedure. Furthermore, with data "00", the threshold voltage is similarly made 5.7 V or higher.

Thus, in the four-valued flash memory as the nonvolatile semiconductor memory device of the second embodiment, since a voltage increment $\Delta Vg$ can be set in units of devices (in units of chips), a voltage increment $\Delta Vg$ matching a write characteristic of a device can be set, and, consequently, a distribution of threshold voltages of memory cells particularly storing a median voltage value of data "01" or "10" can be made less wide. Therefore, a nonvolatile semiconductor memory device with which a highly reliable multi-valued write operation without any read failure can be provided.

Furthermore, since a voltage increment $\Delta Vg$ reflecting test results can be set, reliability can be improved.

Furthermore, since a voltage increment $\Delta Vg$ is set in units of devices (in units of chips), the nonvolatile semiconductor memory device of the present invention is not limited by the write method, and can also be applied to a write method such as a channel hot electron method or a method using an FN (Fowler-Nordheim) tunnel phenomenon.

Furthermore, the nonvolatile semiconductor memory device of the present invention is not limited by a memory cell array structure such as a NOR type, NAND type or AND type, or a memory cell structure such as a triple well structure, either.

Furthermore, in the first and second embodiments, a write operation is explained with a write method by implantation of electrons to a floating gate, but the present invention can also be applied in the case where a write operation is performed by a method of pulling electrons from the floating gate.

Furthermore, in the first and second embodiments, to simplify the explanation, the case where a program (write) operation of all the data "10", "01" and "00" is started from 6 V is exemplified. However, to shorten time for a write operation, a higher write voltage may be set as a start voltage for data "01" corresponding to a high threshold voltage. Furthermore, an even higher write voltage may be set as a start voltage for data "00" so that start voltages differ depending on the data "10", "01" and "00".

It is sufficient to appropriately set the number of bits in control signals such as the control signal WLVS and the selection control signals CD, CVD, as well as voltage increments ΔVg used in the explanation of the first and second embodiment depending on a required voltage increment ΔVg and a variation width of the write characteristics.

Furthermore, in the second embodiment, an nMOS transistor HS that is obviously not to be used from a set range of voltage increments ΔVg may be eliminated (for example, transistors HS1–HS9 in Table 2, etc.). Furthermore, only transistors (for example, transistors HS10–HS15 for the transistor HS12) corresponding to a voltage increment ΔVg depending on the write characteristic variation may be disposed from a central value at each step as with transistors HS12, HS24, HS36, . . .

In the first and second embodiments, a voltage increment ΔVg is selected from connection nodes of resistors R1 connected in series in the word line voltage control circuit, but voltage generation by a resistive potential divider made of resistors connected in series is a simplest method that does not require a large layout area. Even when resistance values vary by device (chip) manufacturing conditions, a stable voltage increment ΔVg can be reliably obtained since a resistance ratio is stable.

In the first and second embodiments, a four-valued flash memory as a nonvolatile semiconductor memory device is explained, but the present invention can be applied not only to a four-valued flash memory, but also a nonvolatile semiconductor memory device in which charged states corresponding to three or more values are formed in a floating gate.

As described above, according to the nonvolatile semiconductor memory device of the present invention, shift amount of a threshold voltage with one pulse can be made a predetermined value (about 0.3 V) without being affected by variations in device characteristic, deterioration of a write speed can be prevented, a read margin can be secured, and hence reliability can be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrically writable and erasable nonvolatile semiconductor memory device composed of one or more chips and having memory cells respectively constituted by a floating gate field effect transistor including a control gate, a drain, a source and a floating gate, wherein charged states corresponding to three or more values are generated in the floating gate, comprising:

write means that, at the time of write operation for generating one of two or more charged states of the floating gate corresponding to two or more values, performs a first step of applying a write pulse being a positive write start voltage to the control gate, and thereafter repeatedly performs a second step of applying a write pulse to the control gate of the transistor of a memory cell which is not judged to be in a predetermined charged state, wherein the write pulse in the second step is repeatedly raised by a voltage increment until the transistor of the memory cell becomes the predetermined charged state, wherein a voltage increment setting means for setting the voltage increment in the second step for each chip.

2. The nonvolatile semiconductor memory device according to claim 1, wherein the write means includes:

voltage supply means for supplying a voltage to the control gate;

write control means for outputting a write control signal to the voltage supply means; and storage means for storing information of the voltage increment; and the voltage supply means successively supplies voltages raised by the voltage increment based on the information of the voltage increment stored in the storage means to the control gate according to a write control signal from the write control means.

3. The nonvolatile semiconductor memory device according to claim 2, wherein information of the voltage increment by which a change of the threshold voltage of a memory cell obtained by a test of a write characteristic becomes a predetermined voltage is stored in the storage means.

4. The nonvolatile semiconductor memory device according to claim 2, wherein a memory cell having the same constitution as the memory cell is used as the storage means.

5. The nonvolatile semiconductor memory device according to claim 2, wherein the voltage supply means supplies a voltage generated by a resistive potential divider to the control gate.

6. The nonvolatile semiconductor memory device according to claim 1, wherein the write means includes:

voltage supply means for supplying a voltage to the control gate;

write control means for outputting a write control signal to the voltage supply means; and storage means for storing a numerical value corresponding to the voltage increment as information of the voltage increment;

the write control means successively adds a numerical value corresponding to the voltage increment stored in the storage means to the positive write start voltage, and outputs a write control signal representing the positive write start voltage and added results; and the voltage supply means supplies a voltage corresponding to the write control signal from the write control means to the control gate.

* * * * *